Figure 1A:
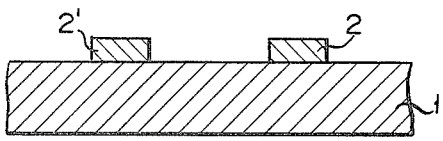

United States Patent [19]

Sumitomo et al.

[11] 4,185,294
[45] Jan. 22, 1980

[54] SEMICONDUCTOR DEVICE AND A METHOD FOR MANUFACTURING THE SAME

[75] Inventors: Yasusuke Sumitomo, Yokohama; Yoshie Ohashi, Fujisawa, both of Japan

[73] Assignee: Tokyo Shibaura Electric Co., Ltd., Kawasaki, Japan

[21] Appl. No.: 897,198

[22] Filed: Apr. 17, 1978

Related U.S. Application Data

[62] Division of Ser. No. 748,897, Dec. 9, 1976, Pat. No. 4,123,565.

[30] Foreign Application Priority Data

Dec. 10, 1975 [JP] Japan ............................... 50-146368

[51] Int. Cl.² ..................... H01L 29/34; H01L 23/30; H01L 23/48
[52] U.S. Cl. ........................ 357/54; 357/71; 357/73
[58] Field of Search ....................... 357/54, 71, 68, 73

[56] References Cited

U.S. PATENT DOCUMENTS

| 3,766,445 | 10/1973 | Reuter et al. | 357/71 |
| 3,801,880 | 4/1974 | Harada et al. | 357/71 |
| 3,833,919 | 9/1974 | Naber | 357/71 |
| 3,838,442 | 9/1974 | Humphreys | 357/71 |
| 3,890,636 | 6/1975 | Harada et al. | 357/71 |
| 4,001,870 | 1/1977 | Saiki et al. | 357/72 |
| 4,017,886 | 4/1977 | Tomono | 357/71 |
| 4,040,083 | 8/1977 | Saiki et al. | 357/72 |

Primary Examiner—Andrew J. James
Attorney, Agent, or Firm—Finnegan, Henderson, Farabow & Garrett

[57] ABSTRACT

A semiconductor device comprises a semiconductor substrate, an insulating layer formed on one surface of the semiconductor substrate, a wiring layer formed on at least a portion of that area of the semiconductor substrate where no insulating layer is formed and having substantially the same thickness as that of the insulating layer, an insulating film formed flat on the insulating layer and wiring layer in a manner that it occupies grooves between the insulating layer and the wiring layer, an intermediate insulating layer formed on the insulating film, and another wiring layer formed on the intermediate insulating layer. The semiconductor device has a rupture-free multi-layer structure which exhibits an excellent electrical property.

6 Claims, 11 Drawing Figures

SEMICONDUCTOR DEVICE AND A METHOD FOR MANUFACTURING THE SAME

This is a division of application Ser. No. 748,897, filed Dec. 9, 1976 now U.S. Pat. No. 4,123,565.

This invention relates to a semiconductor device and a method for manufacturing the same, and in particular an improvement in the multi-layer wiring structure of a semiconductor device.

In a semiconductor integrated circuit, for example, wiring is formed in a predetermined pattern on a layer to make an intervoltage connection. With a high integration of the integrated circuit a multi-layer wiring structure has been widely used in which such wiring layers are superposed multiply one upon another. The multi-layer wiring structure is provided by multiply superposing a plurality of wiring layers one upon another through an electrically insulating layer. If in this case any stepped portions or projections are provided on the wiring layer a multi-layer structure is complicated, making it difficult to fabricate an integrated circuit and impairing the electrical property of the integrated circuit. This will be explained by referring to FIGS. 1a to 1c.

Figure 1B:
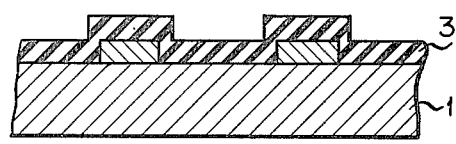
Figure 1C:
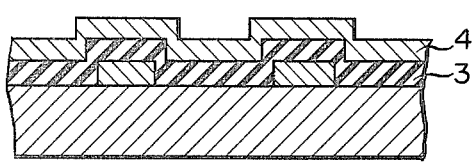
Figure 1C:
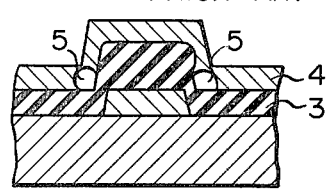

As shown in FIG. 1a aluminum is evaporated on one surface of a substrate 1 and photoetching is effected on the Al layer to provide first wiring layers 2, 2′ of predetermined pattern. In FIGS. 1a to 1c a detail of the cross-section of the substrate is omitted for simplicity.

In actual practice, however, electrode areas are formed on one surface of a silicon substrate, a SiO$_2$ film is coated on the resultant structure and holes are provided in the SiO$_2$ film to make an electrical connection with the electrode areas.

Then, a SiO$_2$ insulating layer 3 is coated by a CVD (Chemical Vapor Deposition) method on the wiring layers 2, 2′ and substrate 1 as shown in FIG. 1b. Aluminum is evaporated onto the resultant SiO$_2$ insulating layer 3 and photoetching is effected on the Al layer to provide a second wiring layer 4 of predetermined pattern as shown in FIG. 1c. As will be evident from FIG. 1c, the second wiring layer 4 lies astride of that stepped portion of the SiO$_2$ layer 3 which results from the formation of the first wiring layer 2 and, for this reason, the second wiring layer 4 is difficult to provide on the stepped portion of the SiO$_2$ layer 3. As a result, the second wiring layer 4 opens, or is made extremely thinner, in a position where the stepped portion of the SiO$_2$ layer 3 is formed, adversely affecting the reliability of the resultant semiconductor device. When PSG (Phosphor Silicate Glass) is used as an electrically insulating layer, a "sticking effect" is liable to occur at the shoulder of the stepped portion of the electrically insulating layer 3. When the "sticking effect" so occurs, an etching solution flows around the base of the stepped portion of the electrically insulating layer 3, causing a defective area 5 to be formed at the base of the stepped portion of the electrically insulating layer 3 as shown in FIG. 1c′.

In order to prevent such a drawback means is taken to make the stepped portion of the first wiring layer and first electrically insulating layer inclined. However, such a means has proved unsuitable for mass production due to its poor reproduction and a wide pattern spacing is required also, thus providing a bar to miniaturization and high integration of the integrated circuit. Furthermore, such means is not applicable to third and fourth wiring layers due to the presence of the stepped portion.

To avoid such a drawback a first insulating layer can be formed substantially flush with the first wiring layer so that no stepped portion is formed. Such first insulating and wiring layers can be formed, for example, by a lift off method as will later be described. Where a second electrically insulating layer is coated by the CVD method onto the first insulating and wiring layers which are formed by the lift off method, a different vapor growth speed is involved between the first wiring layer and the first electrically insulating layer. As a result, an opening or rupture of the subsequent wiring layer is liable to occur and the reliability of the resultant semiconductor device is lowered. Furthermore, the semiconductor device is manufactured in poor yield. There is a chance that grooves or voids will be formed between the first wiring and electrically insulating layers. If in this case a second insulating layer is coated thereon, a stepped portion is created and the resultant semiconductor device suffers from the above-mentioned drawbacks.

An object of this invention provides a semiconductor device of multi-layer wiring structure which has wiring layers of predetermined thickness, has no stepped portion as formed at the intersection of wiring layers and exhibits an excellent insulating property between the wiring layers.

Another object of this invention is to provide a method for manufacturing the above mentioned semiconductor device.

According to one aspect of this invention there is provided a semiconductor device comprising a semiconductor substrate, an insulating layer formed on one surface of the semiconductor substrate, a wiring layer formed on at least a portion of that area of the semiconductor substrate where no insulating layer is formed and having substantially the same thickness as that of the insulating layer, an insulating film formed flat on the insulating layer and wiring layer in a manner that it occupies grooves between the insulating layer and the wiring layer, an intermediate insulating layer formed on the insulating film, and another wiring layer formed on the intermediate insulating layer.

According to another aspect of this invention there is provided a semiconductor device comprising a semiconductor substrate; an insulating layer formed on one surface of the semiconductor substrate; a wiring layer formed on at least a portion of that area of the semiconductor substrate where no insulating layer is formed and having substantially the same thickness as that of the insulating layer; an insulating film formed flat on the insulating layer and wiring layer in a manner that it occupies grooves between the insulating layer and the wiring layer, an intermediate insulating layer formed on the insulating film; at least one layer structure formed on the intermediate insulating layer and comprising an insulating layer, a wiring layer, an insulating film and an intermediate insulating layer as formed as mentioned above; and another wiring layer formed on the layer structure.

In another aspect of this invention there is provided a method for manufacturing a semiconductor device, comprising the steps of forming an insulating layer and wiring layer on one surface of a semiconductor substrate, said wiring layer being formed on at least a portion of that area of the insulating layer where no insulating layer is formed and having substantially the same thickness as that of the insulating layer; forming an insulating film flat on the insulating layer and wiring layer in a manner that it occupies grooves between the insulating layer and the wiring layer, forming an intermediate insulating layer on the insulating film; and forming another wiring layer on the intermediate insulating layer.

In another aspect of this invention there is provided a method for manufacturing a semiconductor device, comprising the steps of forming an insulating layer and wiring layer on one surface of a semiconductor substrate; forming an insulating film flat on the insulating layer and wiring layer in a manner that it occupies grooves between the insulating layer and the wiring layer; forming an intermediate insulating layer on the insulating film; forming on the intermediate insulating layer at least one layer structure comprising an insulating layer, a wiring layer, an insulating film and an intermediate layer as formed as mentioned above; and forming another wiring layer on the layer structure.

Figure 2:
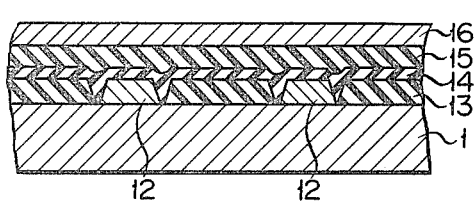

This invention will be further described by way of example by referring to the accompanying drawings in which:

FIGS. 1a to 1c' are cross-sectional views for explaining the steps for manufacturing a conventional semiconductor device;

FIG. 2 is a cross-sectional view showing a semiconductor device according to the embodiment of this invention; and FIGS. 3a to 3f are cross-sectional views for explaining the steps of manufacturing the semiconductor device of FIG. 2.

This invention is characterized in that in a multi-layer wiring structure of a semiconductor device a substantially even insulating film is formed on a wiring layer and an insulating layer formed flush with the wiring layer. The semiconductor device comprising a two-layer wiring structure will be explained below.

In FIG. 2, electrode areas, an insulating layer covering the electrode areas and openings through which the electrode areas are connected are formed on one surface of a substrate 1, but they are omitted for brevity. On the surface of the substrate 1 are formed first wiring layers 12 and a first insulating layer 13 which is formed substantially flush with the first wiring layers 12 in a manner that the first wiring layers 12 are embedded in the first insulating layer 13. A substantially even insulating film 14 is formed on the first wiring layers 12 and first insulating layer 13 in a manner that grooves between the first wiring layers 12 and the first insulating layer 13 are filled with insulating material of layer 14. A second insulating layer 15 is formed on the insulating film 14 and a second wiring layer 16 is formed on the second insulating layer 15. The second wiring layer 16 is usually connected to the first wiring layers 12, but such a connection is not necessary. In the above-mentioned semiconductor device, the insulating layer 13 having substantially the same thickness as that of the wiring layers 12 is formed between the wiring layers 12. Such a semiconductor device can be manufactured by a lift off method.

Figure 3A:
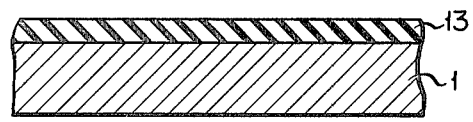
Figure 3B:
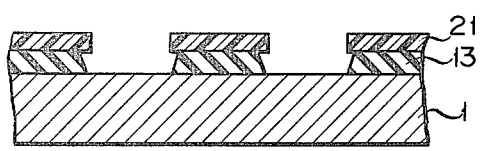
Figure 3C:
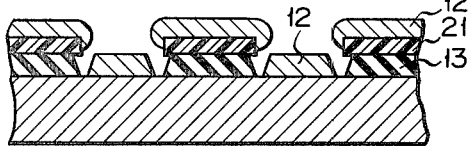
Figure 3D:
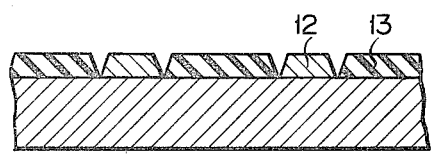
Figure 3E:
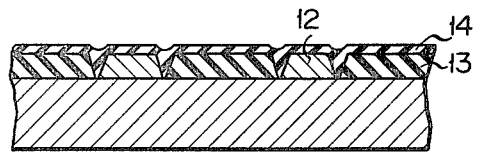
Figure 3F:
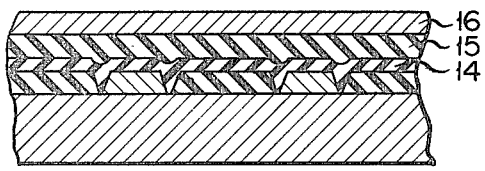

A method for manufacturing a semiconductor device according to one embodiment of this invention will be explained below with further reference to FIGS. 32 to 3f.

An about 1μ thick SiO₂ insulating layer 13 is formed by the CVD method on one surface of a semiconductor substrate, for example, a silicon substrate 1 as shown in FIG. 32. It is to be noted that electrode areas, SiO₂ layer covering the electrode area and openings through which the electrode areas are connected are formed on the surface of the semiconductor substrate, but they are omitted for brevity. A resist layer 21 is formed on the SiO₂ layer 13 and the SiO₂ layer 13 is etched by an etching solution such as NH₄F with the resist layer 21 as a mask in order to form a subsequent wiring layer (FIG. 3b). The formation of the resist layer 21 is effected using Negaresist OMR-83 (trade name, manufactured by TOKYO OKA K.K.) and an excellent result is obtained. Etching of the SiO₂ layer 13 proceeds first from that portion of the SiO₂ layer which contacts the resist layer 21, leaving a V-shaped groove. The resist layer 21 overhangs the V-shaped groove in an eaveslike fashion. The overhanging structure plays an important part in using the lift off method. Then, for example, aluminium is evaporated in thickness of 1μ on the resultant semiconductor structure to form first wiring layers 12 (FIG. 3c). The first wiring layer 12 opens or is broken (FIG. 3c) due to the overhanging structure of the resist layer 21. Next, the resist layer 21 is removed together with that portion of the wiring layer 12 on the resist layer using a resist layer stripping agent (FIG. 3d). As a result, the remaining wiring layer 12 is formed substantially flush with the insulating layer 13. That is, the wiring layer 12 is embedded in the insulating layer 13. A clearance or groove of 1 to 1.5μ is left between the wiring layer 12 and the insulating layer 13.

Then, liquid insulating material is coated on the resultant structure. As the liquid insulating material, use may be made of liquid silica. As the liquid silica, OCD (trade name, manufactured by TOKYO OKA K.K.) bearing 5.9% of SiO₂ may be used. A spinner method is used as a method for coating the liquid silica. Coating is effected by the spinner method at 4200rpm and the coated structure is burnt at 220° C. in air for 10 minutes. The coating and burning processes are carried out once more. As a result, a silica film 14 having a thickness of preferably 1000 to 1500Å is formed as shown in FIG. 3e. For a thickness below 1000Å the silica does not completely fill the groove between the wiring layer 12 and the insulating layer 13 and for a thickness above 1500Å the resulting silica film is liable to crack. The coating thickness is effected to prevent a possible crack and to fill the groove between the wiring layer 12 and the insulating layer 13 with silica. As a result, a maximum height difference between that area of the silica film below which the groove is provided and the other area of the silica film is below 2000Å. Then, an intermediate insulating layer 15 is formed on the silica film 14 as shown in FIG. 3f. As the intermediate insulating layer, PSG is preferred and its thickness is preferably of the order of 1μ. The intermediate insulating layer 15 is etched to provides holes through which the first wiring layer is electrically connect to the next wiring layer. Where three or more wiring layers are provided, the corresponding wiring layers are formed by the lift off method.

Then, a second wiring layer 16 is formed by a usual method. That is, aluminium is evaporated in thickness of about 1.5μ on the intermediate layer 15 and photoetching is effected on the Al layer to form the second wiring layer 16 of a predetermined pattern (FIG. 3f). In this way, the two-layer wiring structure is obtained.

According to this invention, the formation of the wiring layer is preferably effected by the lift off method. That is, since the wiring layer opens due to the overhanging structure of the resist layer, a resist stripping agent reaches easily to the resist layer. As a result, the resist layer is removed perfectly. Since the liquid insulating material such as liquid silica is coated on the wiring layer and the insulating layer, the groove between the wiring layer and the insulating layer is completely filled, thereby improving an evenness of the surface. For this reason, the wiring layer is easily provided in a predetermined thickness and it is possible to provide a good insulation between the wiring layers. It is to be noted that, since according to this invention the insulating film such as the silica film is formed on the wiring layer and the insulating layer, and the intermediate insulating layer is formed by the CVD method on the insulating film, it is possible to prevent the vapor growth from occurring at a different speed as encountered when no silica film is formed on the ground, i.e., on the metal wiring layer and the insulating layer such as the $SiO_2$ layer. It is also possible to prevent occurrence of a "hillock" which might otherwise occur when the Al wiring layer covered with the insulating film is subjected to a heat treatment.

The multi-layer wiring structure of this invention has the above-mentioned advantages and it provides, if applied to the integrated circuit, a fine and accurate wiring pattern.

As the semiconductor substrate, use may be made of a ceramics substrate, etc. In this case, a material commensurate with that of the substrate is used as the intermediate insulating material.

What we claim is:

1. A semiconductor device comprising a semiconductor substrate; a first insulating layer formed on a portion of one surface of the semiconductor substrate; a first wiring layer formed on at least a portion of the one surface of the semiconductor substrate where the first insulating layer is not formed and having substantially the same thickness as the first insulating layer, grooves being formed between said first insulating layer and said first wiring layer for separating said layers; an insulating film formed in a substantially fl t plane on the first insulating and first wiring layers for occupying the grooves between said first insulating and first wiring layers; an intermediate insulating layer formed on the insulating film; and a second wiring layer formed on the intermediate insulating layer.

2. A semiconductor device according to claim 1, in which said insulating film is formed by coating a liquid silica.

3. A semiconductor device according to claim 2, in which said silica film has a thickness of 1000 to 1500Å.

4. A semiconductor device comprising a semiconductor substrate; a first insulating layer formed on a portion of one surface of the semiconductor substrate; a first wiring layer formed on at least a portion of the one surface of the semiconductor substrate where the first insulating layer is not formed and having substantially the same thickness as that of the first insulating layer, grooves being formed between said first insulating layer and said first wiring layer for separating said layers; an insulating film formed in a substantially flat plane on the first insulating and first wiring layers for occupying the grooves between the first insulating and first wiring layers; an intermediate insulating layer formed on the insulating film; at least one layer structure formed on the intermediate insulating layer and comprising an insulating layer, a wiring layer, an insulating film and an intermediate layer as formed above; and another wiring layer formed on said at least one layer structure.

5. A semiconductor device according to claim 4, in which the insulating film is a silica film formed by coating a liquid silica.

6. A semiconductor device according to claim 2, in which the silica film has a thickness of 1000 to 1500Å.

* * * * *

UNITED STATES PATENT AND TRADEMARK OFFICE
CERTIFICATE OF CORRECTION

PATENT NO. : 4,185,294

DATED : Jan. 22, 1980

INVENTOR(S) : Yasusuke Sumitomo and Yoshie Ohashi

It is certified that error appears in the above-identified patent and that said Letters Patent are hereby corrected as shown below:

IN THE TITLE:

"SEMICONDUCTOR DEVICE AND A METHOD FOR MANUFACTURING THE SAME"

Should Read:

-- SEMICONDUCTOR DEVICE HAVING A MULTI-LAYER WIRING STRUCTURE--

Signed and Sealed this

Twenty-fourth Day of June 1980

[SEAL]

Attest:

SIDNEY A. DIAMOND

Attesting Officer

Commissioner of Patents and Trademarks